United States Patent
Lowrey et al.

(10) Patent No.: US 7,967,994 B2
(45) Date of Patent: Jun. 28, 2011

(54) METHOD AND APPARATUS FOR CHALCOGENIDE DEVICE FORMATION

(75) Inventors: Tyler Lowrey, Rochester Hills, MI (US); Stanford R. Ovshinsky, Bloomfield Hills, MI (US)

(73) Assignee: Ovonyx, Inc., Troy, MI (US)

( * ) Notice: Subject to any disclaimer, the term of this patent is extended or adjusted under 35 U.S.C. 154(b) by 573 days.

(21) Appl. No.: 11/977,520

(22) Filed: Oct. 25, 2007

(65) Prior Publication Data

US 2009/0111212 A1  Apr. 30, 2009

(51) Int. Cl.
*C03C 25/68* (2006.01)

(52) U.S. Cl. ........................................ 216/58

(58) Field of Classification Search ............. 216/58; 438/102, 95; 118/723 R; 257/E45.002; 414/147, 414/217, 222.01, 404, 572
See application file for complete search history.

(56) References Cited

U.S. PATENT DOCUMENTS

| | | | |
|---|---|---|---|
| 5,177,567 A * | 1/1993 | Klersy et al. | 257/4 |
| 7,256,130 B2 * | 8/2007 | Spandre | 438/710 |
| 2004/0151562 A1 * | 8/2004 | Hofmeister et al. | 414/217 |
| 2005/0218507 A1 * | 10/2005 | Kao et al. | 257/704 |
| 2005/0286041 A1 * | 12/2005 | Ham et al. | 355/75 |
| 2006/0151771 A1 * | 7/2006 | Asano et al. | 257/2 |
| 2007/0227878 A1 * | 10/2007 | Hamamjy et al. | 204/192.12 |

FOREIGN PATENT DOCUMENTS

WO  WO2007/029938  *  3/2007

* cited by examiner

*Primary Examiner* — Nadine G Norton
*Assistant Examiner* — Patti Lin
(74) *Attorney, Agent, or Firm* — Kevin L. Bray (57) ABSTRACT

Chalcogenide devices are delineated and sidewalls of the devices are sealed, in an anaerobic and/or anhydrous environment environment. Throughout the delineation and sealing steps, and any intervening steps, the sidewalls are not exposed to oxygen or water. In an illustrative embodiment, a cluster tool includes an etching tool and a sealing/deposition tool configured to etch and seal the chalcogenide devices and to maintain the devices in an anaerobic and/or anhydrous environment throughout the process.

8 Claims, 4 Drawing Sheets

METHOD AND APPARATUS FOR CHALCOGENIDE DEVICE FORMATION

CROSS-REFERENCE TO RELATED APPLICATIONS

Field of Invention

This invention relates to processing chalcogenide devices. More particularly, this invention relates to improved methods and apparatuses for forming chalcogenide phase change and threshold switch devices.

BACKGROUND OF THE INVENTION

Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In the chalcogenides, the resistivity varies by two or more orders of magnitude when the material passes from the amorphous (more resistive) phase to the crystalline (more conductive) phase, and vice versa. In the amorphous state, moreover, the resistivity depends to a marked extent upon the temperature.

A chalcogenide memory device may utilize the wide range of resistance values available for the material as the basis of memory operation. Each resistance value corresponds to a distinct structural state of the chalcogenide material and one or more of the states can be selected and used to define operation memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. The range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are stable. Above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then cool it off rapidly, i.e. quench. From the electrical standpoint, it is possible to reach the crystallization and melting temperatures by causing a current to flow through a crystalline resistive element that heats the chalogenic material by the Joule effect.

Each memory state of a chalcogenide memory material corresponds to a distinct resistance value and each memory resistance value signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information.

Each memory state can be programmed by providing the current pulse characteristics of the state and each state can be identified, or "read", in a non-destructive fashion by measuring the resistance. Programming among the different states is fully reversible and the memory devices can be written and read over a virtually unlimited number of cycles to provide robust and reliable operation. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovana et al.; and "Morphing Memory," published in IEEE Spectrum, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical chalcogenide materials.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may also be the resultant of a reactive sputtering process: a chalcogenide nitride, or oxide, for example and chalcogenide may be modified by an ion implantation or other process.

Early work in chalcogenide devices demonstrated electrical switching behavior in which switching from an "off" resistive state to an "on" conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultrafast switching speeds. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; the disclosures of which are hereby incorporated by reference. Three-terminal OTS devices are disclosed, for example, in U.S. Pat. Nos. 6,969,867 and 6,967,344; the disclosures of which are hereby incorporated by reference.

Chalcogenide devices, such as OUM or OTS devices, may be formed on a bare substrate or on a substrate that includes substantially formed circuits, such as a CMOS microprocessor, for example. During the processing of a chalcogenide-based device, the surface of the chalcogenide material may be exposed, at various steps, to oxygen, water, or other substances within the ambient environment. While not wishing to be bound by theory, it is believed that exposure to such substances could lead to absorption of the substances by the chalcogenide material and to the migration of such substances into the chalcogenide. Such an introduction of oxygen or water could induce inhomogeneities within the chalcogenide and lead to degradation of an associated device's electrical characteristics. A process for forming chalcogenide-based devices that reduces the incidental exposure of chalcogenide material to such substances would therefore be highly desirable.

SUMMARY OF THE INVENTION

A method and apparatus in accordance with the principles of the present invention may employ conventional techniques in the process of forming a chalcogenide device. However, at a critical juncture, when the chalcogenide material might otherwise be exposed to oxygen or water, a method and apparatus in accordance with the principles of the present invention shields the chalcogenide material from such exposure. During the process of device patterning, a method and apparatus in accordance with the principles of the present invention blocks the exposure of chalcogenide to oxygen and water, thereby ensuring that no oxygen or water is inadvertently absorbed by the chalcogenide. By thus blocking such absorption, a method and apparatus in accordance with the principles of the present invention may prevent the formation of inhomogeneities within the chalcogenide that could degrade the performance of the chalcogenide devices.

A system in accordance with the principles of the present invention includes one or more processing tools that provide for the anaerobic anhydrous processing of chalcogenide devices. In an illustrative embodiment, a single tool includes separate chambers within which partially completed wafers may be patterned (that is, divided into individual devices) and sealed after patterning. In accordance with the principles of the present invention, each partially completed wafer includes a blanket layer of top electrode material atop a blanket layer of chalcogenide material, with both layers formed in situ in an anaerobic and/or anhydrous environment. Because the single tool includes facilities both for patterning and sealing, the sidewalls of individual devices may be exposed only to the tool's ambient atmosphere during the patterning step within a patterning chamber without exposing the chalcogenide sidewalls to oxygen or water. The patterned wafer may then be moved, within the tool environment, to a sealing chamber, where the chalcogenide sidewalls are hermetically sealed using, for example, a thin film deposition of SiN or Si3N4.

In another illustrative embodiment, a hermetically-sealed transport box, such as a front opening unified pod(FOUP), is employed to transport wafers among standalone tools, each tool configured with a loadlock that permits wafers to remain in an anaerobic anhydrous environment between processing steps performed in different chambers.

In accordance with the principles of the present invention, the controlled-environment container is substantially free of oxygen and water. The container may, for example, be purged and filled with nitrogen gas, or may be under vacuum, or may be filled with nitrogen gas at low pressure, for example. In accordance with the principles of the present invention, the partially completed wafers may include a blanket layer of top electrode material atop a blanket layer of chalcogenide material, with both layers formed in situ in an anaerobic and/or anhydrous environment. The controlled-environment container is employed to move wafers from a patterning chamber, in which chalcogenide sidewalls are exposed during the patterning operation, to a sealing chamber in which the chalcogenide sidewalls are hermetically sealed.

Additional chambers and operations may be performed in accordance with the principles of the present invention. A cleaning chamber may be employed, for example, between the patterning and sealing steps to clean device sidewalls exposed in the patterning step. A cluster tool system embodiment, or standalone tool system in combination with a controlled-environment container may be employed in accordance with the principles of the present invention to transport patterned wafers into the clean chamber and, from there, to the sealing chamber while maintaining an anaerobic and/or anhydrous environment.

Additionally, a chamber for depositing the chalcogenide devices' interconnect layer (that is, the metal films that connect various circuit elements within a die, such as OUM cells and row and column address lines) may be included in a system in accordance with the principles of the present invention.

DETAILED DESCRIPTION

Although this invention will be described in terms of certain preferred embodiments, other embodiments, including embodiments that do not provide all of the benefits and features set forth herein, are also within the scope of this invention. Various structural, logical, process step, chemical, and electrical changes may be made without departing from the spirit or scope of the invention. Flow charts may include steps that may be deleted or otherwise modified and the sequence set forth within a particular flow chart may be modified while keeping within the scope of the invention. Although generally described in terms of lithographic processes, direct-write processing of chalcogenide devices is also contemplated within the scope of the invention. Systems and methods in accordance with the principles of the present invention contemplate the use of wet etch processes as well as the dry etch processes described for illustrative purposes. Accordingly, the scope of the invention is defined only by reference to the appended claims.

Figure 1:
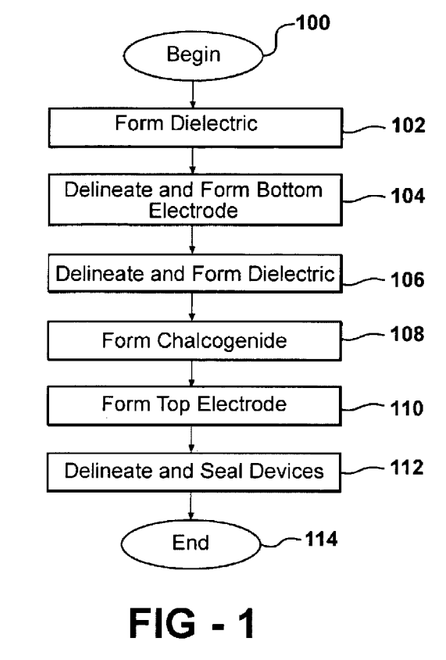
FIG. 1 is a flow chart that illustrates the main steps employed by a system in accordance with the principles of the present invention to prevent oxygen or water contamination of chalcogenide devices.

The flow chart of FIG. 1 outlines the steps by which chalcogenide devices (e.g. OUM or OTS devices) in accordance with the principles of the present invention may be formed in an illustrative embodiment. The process begins in step 100 with a substrate that may be, for example, a blank silicon wafer, a silicon wafer that already has circuitry formed in it, a layer of glass, ceramic, or plastic, or any other suitable material that may be used to support chalcogenide devices to be formed thereon. From step 100 the process proceeds to step 102 where a dielectric layer is formed over the substrate. The dielectric layer isolates the chalcogenide devices from the substrate below. Typically, the dielectric layer may be a 1000 Å-7000 Å thick layer of $SiO_2$, formed using a low pressure high density plasma chemical vapor deposition (HDP) process.

From step 102 the process proceeds to step 104 where a bottom electrode is formed. The bottom electrode (in the case of an OUM) is formed of a material that provides both electrical and thermal resistance. Using such a material provides for more efficient heating of the phase change material within an OUM cell and, consequently, significantly reduces the current required to RESET or SET such a cell. Various materials, including TiN, TiSiN, or TiAlN, for example, may be deposited using, for example, a PVD or CVD process to form the bottom electrode. The bottom electrode can be configured by forming features using standard lithography and etch techniques. It can also be configured by a CMP process leaving the bottom electrode patterned in the recessed regions.

After forming and delineating the bottom electrode in step 104, a layer of dielectric material may be formed on top of the bottom electrode layer. This dielectric layer may be formed using a plasma enhanced chemical vapor deposition (PECVD) or high density plasma chemical vapor deposition (HDP) process that results in a 300 Å to 1000 Å thick layer of SiN, $Si_3N_4$ or $SiO_2$, for example. In various embodiments of an OUM cell, pores may be formed in this dielectric layer to allow for the introduction of chalcogenide material in a relatively confined volume. Such a confined volume of chalcogenide material allows for relatively low-level current operation of the device.

From step 106, the process proceeds to step 108 where a layer of chalcogenide may be deposited using a sputtering or chemical vapor deposition CVD process. In this illustrative embodiment, the chalcogenide layer is a blanket layer that covers the entire substrate to a substantially uniform thickness of 100 Å to 1000 Å. Various preparations may be employed to ready the bottom contact layer/dielectric layer for deposition of the chalcogenide material. In an illustrative embodiment, the surface is chemically treated to remove any surface contaminents. The surface preparation may include a reactive plasma cleaning (RPC) for example. As a further example the surface preparation may include a soft sputter etch. Additionally, the dielectric layer may be subjected to a densification, via a rapid thermal anneal (RTA). In an illustrative embodiment, the chalcogenide deposition takes place in an anaerobic and/or anhydrous environment.

As will be described briefly in the discussion related to FIGS. 3A through 3E, the chalcogenide layer may be substantially planar, may fill confined volumes, such as pores, and may have contact with electrodes, such as "lance" electrodes, that are shaped to minimize the area of contact between the chalcogenide material and the electrode in order to thereby reduce the current required to program such a device.

After formation of the chalcogenide layer, a top contact layer is deposited in step 110. In an illustrative embodiment, the top contact layer is deposited also in an anaerobic and/or anhydrous environment as the chalcogenide, with no intervening steps that would expose the chalcogenide film to oxygen, water, or water vapor. In this way, with the surface upon which the chalcogenide is deposited purged of water and oxygen, with the chalcogenide deposited in an anaerobic and/or anhydrous environment, and with the top electrode layer deposited without intervening steps in the same anaerobic and/or anhydrous environment, the top contact layer acts to seal the chalcogenide from exposure to oxygen or water. In an illustrative embodiment the top electrode layer is, like the bottom electrode, formed using a PVD or CVD process that deposits a layer of material such as C, W, TiN, TiSiN, or TiAlN, for example.

From step 110 the process proceeds to step 112 where individual chalcogenide devices are formed from the blanket layers that cover the substrate at this point. It is at this point, during the formation of individual devices, that the chalcogenide material might be exposed to oxygen or water. In particular, because individual devices are formed by etching portions of the top-electrode/chalcogenide stack, the sidewalls of the chalcogenide may be exposed to oxygen and/or water at various times during this process. As will be described in greater detail in the discussion related to FIG. 2, a process in accordance with the principles of the present invention shields the exposed chalcogenide sidewalls until they are sealed.

From step 112 the process proceeds to end in step 114. Additional process steps, such as planarization and the formation of interconnects, known in the art may be performed after step 114.

Figure 2:
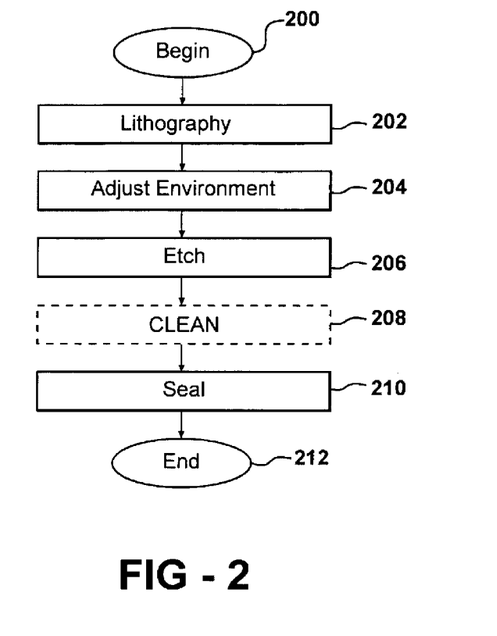
FIG. 2 is a flow chart that illustrates in greater detail the process of preventing the exposure of chalcogenide material to oxygen or water in accordance with the principles of the present invention.
Figure 3A:
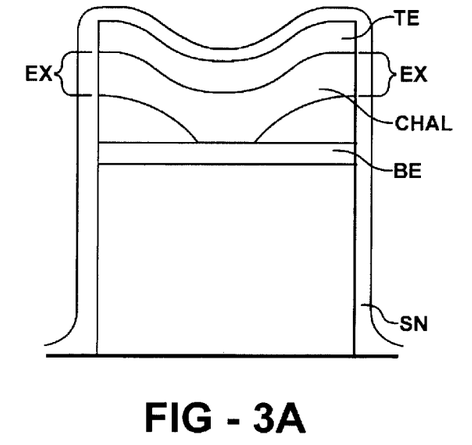
FIGS. 3A through 3E are cross sectional views of illustrative chalcogenide device embodiments that indicated the regions of chalcogenide material that are protected from oxygen and water exposure in accordance with the principles of the present invention.
Figure 3B:
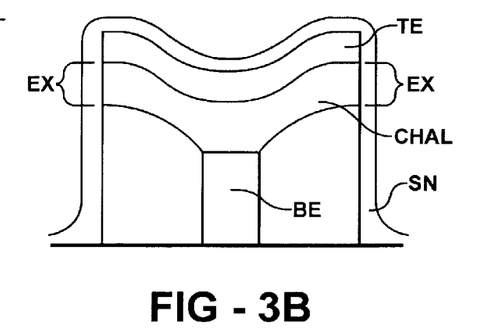
Figure 3C:
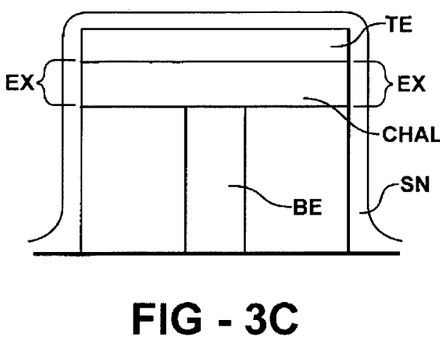
Figure 3D:
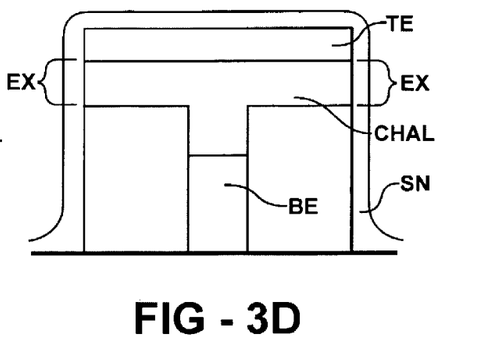
Figure 3E:
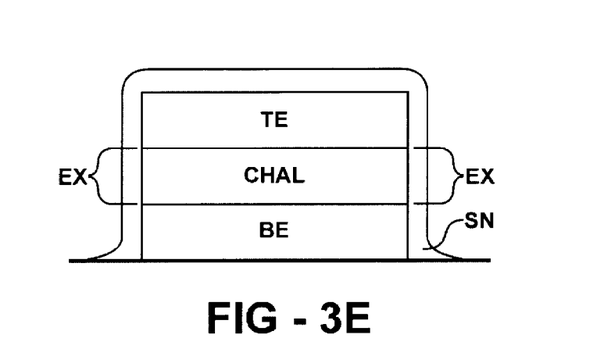

The flow chart of FIG. 2 provides a more detailed outline of the patterning process of step 112 in FIG. 1. For purposes of this discussion, it is assumed that all the steps in forming chalcogenide devices up through the formation of a top contact layer have been performed prior to the beginning of the process related to the flow chart of FIG. 2, that is, prior to the beginning, step 200. As previously noted, the top contact layer substantially shields the chalcogenide layer from such unwanted substances as oxygen and water and exclusion of oxygen and water from the chalcogenide material is focused on the steps during and after the removal of portions of the top contact layer.

From step 200 the process proceeds to step 202 where lithographic steps are performed to begin patterning the chalcogenide stack (also referred to herein as "wafer"). Because the chalcogenide sidewalls will not be exposed in this step, the various functions performed in this step need not be performed in an anaerobic and/or anhydrous environment. More specifically, for example, a layer of photoresist is deposited on the wafer surface, a desired pattern (i.e. one that will separate individual devices, such as OUM cells, on the wafer) is exposed in the photoresist, and the photoresist is developed to form the desired patterns, removing portions of the photoresist to expose portions of the top electrode layer below. As an alternative, a hard mask pattern, formed in a dielectric such as SiO2 may be formed at this time instead.

From this patterning step, the process proceeds to step 204 where the wafer is placed in a processing chamber featuring an environment that either is anaerobic/anhydrous or is made to be anaerobic/anhydrous after placing the wafer within the chamber. The chamber may be pumped to a vacuum, for example, to achieve such a state. In an illustrative embodiment, any residue from the lithographic processing of step 202 is removed from the wafer prior to placing the wafer in the process chamber.

Once in the chamber, the wafer is etched in step 206 to remove portions of the top electrode and chalcogenide layers exposed by the mask created in the lithographic process. The object of removing segments of the various layers is to delineate individual devices within the wafer. In an illustrative embodiment, a hard mask developed in step 202 shields the regions destined to form individual devices from the etch process. Depending upon the structure of the individual devices, additional layers may be etched in the delineation process. In an illustrative embodiment, the etch process may be a high density plasma etch (HDP) process employing halides, such as fluoride, bromide, Cl or other halides for the reactive gas, for example. High density plasma etching is known and disclosed, for example in U.S. Pat. No. 6,307,174 to Yang et al, and U.S. Pat. No. 5,223,085 Kawai et al, which are hereby incorporated by reference. Etching leaves the chalcogenide sidewalls of the delineated devices exposed. In accordance with the principles of the present invention, the anaerobic and/or anhydrous environment of the chamber is maintained to prevent exposure of the chalcogenide to oxygen or water.

After the etching of step 206 the process optionally proceeds to a cleaning step 208. The optional cleaning step may be employed to remove photoresist used to form the mask in the lithographic process of step 202 and to remove polymers developed as a side-effect of the etching that takes place in step 206. Polymers may be removed using a reactive plasma clean (RPC) process, a vapor clean, or a gaseous cleaning step, for example. Such processes are known and described, for example, in U.S. Pat. No. 6,409,891 issued to Lippey et al, which is hereby incorporated by reference. The resist may be removed using a plasma process, for example. Plasma cleaning is a process whereby a reactive species is generated using a plasma source. The reactive species combines with the photoresist to form volatile compounds, which is removed with a vacuum pump.

After the etching of step 206 and the cleaning of step 208 (if used), the process proceeds to step 210 where the device sidewalls, particularly the devices' chalcogenide sidewalls, are sealed. In an illustrative embodiment, a plasma enhanced chemical vapor deposition (PECVD) process is employed to deposit a silicon nitride film, for example, on the chalcogenide sidewalls in order to seal the sidewalls from exposure to substances such as oxygen or water. Preferably, this deposition is done at relatively low temperature in the range of 250 C-350 C. Plasma enhanced chemical vapor deposition is known and described, for example, in U.S. Pat. No. 5,773,100 issued to Chang et al, which is hereby incorporated by reference.

In accordance with the principles of the present invention, the wafer containing the chalcogenide devices remains in an anaerobic and/or anhydrous environment throughout steps 204 through 210. That is, the chalcogenide-device wafer is maintained in an anaerobic and/or anhydrous environment during the etch process of step 206, during the optional cleaning process of step of 208, during the sealing process of step 210, and at all times in between those steps.

As will be described in greater detail in the discussion related to FIGS. 5 and 6, such isolation from oxygen and water may be achieved, for example, by utilizing a cluster tool that includes chambers for etching chalcogenide wafers to delineate devices, for depositing a sealing film, and, optionally, for post-etch cleaning of the wafers. In such a tool, transfer among the various chambers is under vacuum and carried out by a robotic positioner. Alternatively, such oxygen and water isolation may be maintained using a hermetically-sealed transportation box, such as a front opening unified pod (FOUP) that is brought to vacuum, or another environment, such as an N2 environment, and maintains that environment as wafers are loaded into the transport box and transported from tool to tool. From the sealing process of step 210, the process proceeds to end in step 212.

FIGS. 3A through 3E provide cross-sectional views (not to scale), respectively, of a pore cell, a microtrench cell, a lance cell, a recessed lance cell, and a planar cell, all immediately after a sealing step such as described in the discussion related to step 210 of the flow chart of FIG. 2. Each device includes a bottom electrode BE, dielectric material DM, chalcogenide material CHAL and a top electrode TE. The sidewalls of all the devices, most importantly, the chalcogenide sidewalls are sealed with, in this illustrative embodiment, a layer of silicon nitride SN deposited with a plasma-enhanced chemical vapor deposition process. The silicon nitride film SN blocks oxygen and water contamination of the chalcogenide through areas EX that otherwise would be exposed to such contamination.

Figure 4A:
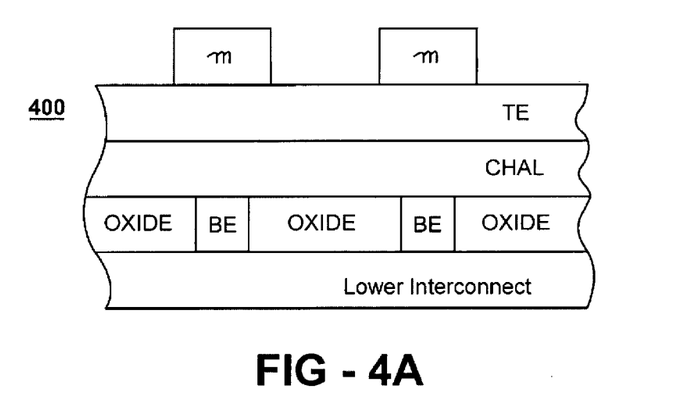
FIGS. 4A through 4D illustrate the execution of process steps that prevent chalcogenide exposure to oxygen or water in accordance with the principles of the present invention.

The cross sectional views (not to scale) of FIGS. 4A through 4D, in sequence, illustrate the process of device delineation in accordance with the principles of the present invention. For simplicity of explanation, the cross-sectional views of FIG. 4A through 4D depict a portion of a wafer of planar chalcogenide devices, such as OUMs. In FIG. 4A the wafer 400 includes layers of lower interconnect (LI), oxide (OX), bottom electrode(BE), chalcogenide (CHAL), and top electrode (TE) materials. Mask portions, M, serve to protect the underlying layers from an etch process, such as that described in the discussion related to the process of step 206 in FIG. 2. The wafer 400 has been processed to a level consistent with that described in step 204 of FIG. 2. That is, a mask has been patterned lithographically and the wafer has been brought to an anaerobic and/or anhydrous environment environment.

Figure 4B:
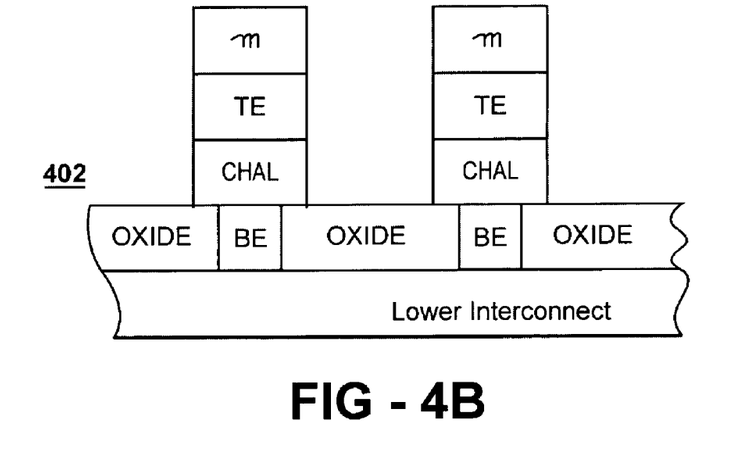

The cross-sectional view of FIG. 4B illustrates the effects of an etching process such as that of step 206 of FIG. 2. The etching process is selective against the mask material M. That is, it tends not to etch material M, or, at least, etches the material M at a slower rate than it etches the top electrode and chalcogenide materials. Individual device stacks 402, including top electrodes TE and a chalcogenide volume CHAL are separated by the etch process. At this point, each device stack is capped by the mask material that protected it during the etch process.

Figure 4C:
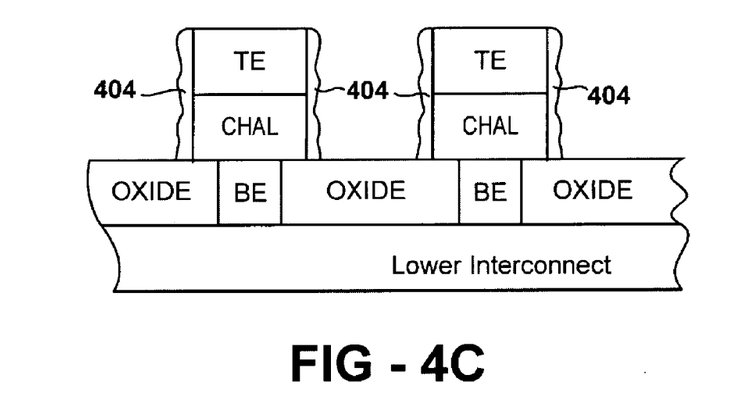

FIG. 4C illustrates the individual device stacks with their respective mask segments removed. Such removal may be accomplished in the optional cleaning step described in relation to the description of step 208. As described there and as illustrated by the film layer 404, a dry etch process may generate a polymer film 404 that adheres to the sidewalls of the device stacks. This layer may be left in place, for example, if the optional cleaning step 208 is not exercised.

Figure 4D:
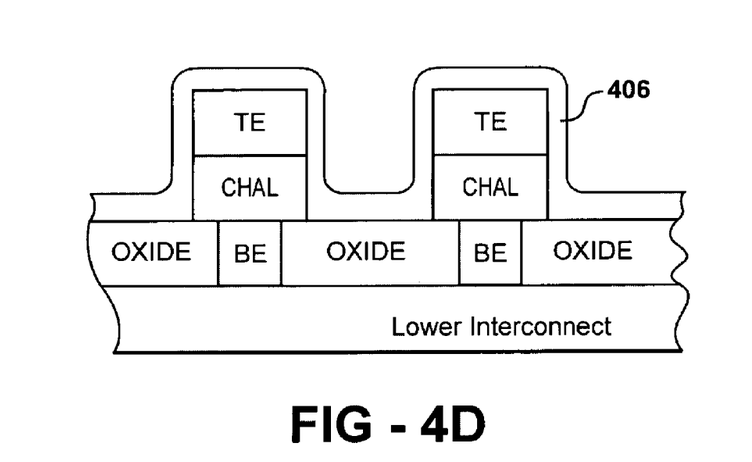

In FIG. 4D a protective film 406 seals the device stacks. As described in the discussion related to step 210, a film such as SiN or $Si_3N_4$ may be deposited to seal the stack and, more particularly, to seal the chalcogenide sidewalls from exposure to oxygen or water.

Figure 5:
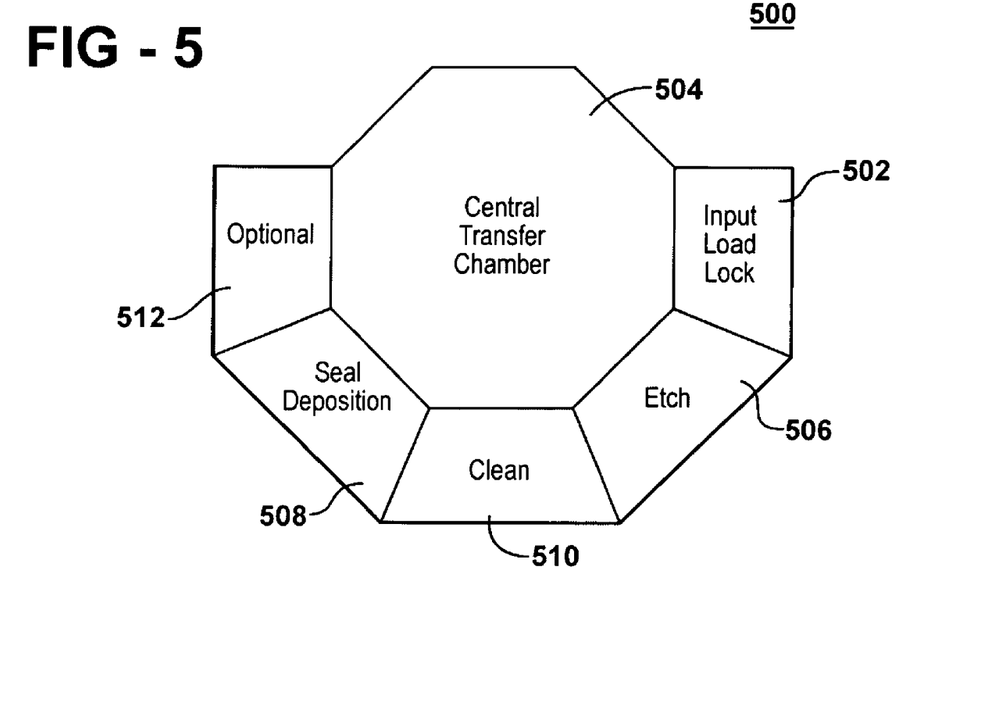
FIG. 5 is a block diagram of a cluster tool embodiment of a system in accordance with the principles of the present invention.

The block diagram of FIG. 5 depicts an illustrative embodiment of a system in accordance with the principles of the present invention in which a cluster tool includes chambers that permit the delineation and sealing of individual chalcogenide devices while eliminating the exposure of the chalcogenide to oxygen or water. In this illustrative embodiment, a cluster tool 500 includes an input loadlock 502, a central transfer chamber 504, an etching chamber 506, and a sealant deposition chamber 508. Optional chambers, such as a cleaning chamber 510 and chamber 512 and may also be included in a cluster tool embodiment in accordance with the principles of the present invention. Cluster tools are known and described, for example, in U.S. Pat. No. 6,852,012 issued to Vepa et al, which is hereby incorporated by reference.

In operation, a wafer (or wafers) of chalcogenide devices may be brought to the cluster tool after the top electrode masking layer has been formed on the wafer and the wafer is ready for device delineation. The wafer is placed in the input loadlock 502 which takes the wafer from the ambient atmosphere of the work space to the anaerobic and/or anhydrous processing environment of the cluster tool 500.

Once brought to the working environment of the cluster tool 500, the wafer may be brought to the central transfer chamber 504 which, in this illustrative embodiment, acts as a transportation hub providing access to process chambers situated around its perimeter. In this illustrative embodiment, the cluster tool 500 includes a robotic handler (not shown) that moves the chalcogenide wafer to and from the input loadlock and among the various chambers.

It is assumed, for the purposes of this illustrative description, that all the cluster tool's chambers are maintained under an anaerobic and/or anhydrous environment. As previously described, in an illustrative embodiment in accordance with the principles of the present invention, before arriving at the cluster tool, the wafer will have been patterned with a mask at the time it arrives at the input loadlock 502 for subsequent processing within the cluster tool 500. The mask will, in combination with an associated etch process, define individual devices within the wafer. The wafer is transferred from the input loadlock 502 to the central transfer chamber 504 and from there to the etch chamber 506.

The wafer is etched in the chamber 506 to delineate individual devices, as previously described. From the etch chamber 506, the wafer is transported to the central transfer chamber 504 and, from there to the optional cleaning chamber 510. As previously noted, the cleaning step and cleaning chamber 510 are optional and may be eliminated in a method and system in accordance with the principles of the present invention. After etching in the etching chamber 506 and, if cleaned in chamber 510, after cleaning in the cleaning chamber 510, the wafer is moved to the central transfer chamber 504 and from there to the sealing chamber 508, where a sealing film is deposited on the individual devices that have been delineated in the etching chamber 506. As previously described, once the sealing film is deposited, the devices may be exposed to atmospheres containing oxygen or water without risk of oxygen or water contamination of the chalcogenide layers. Additional processes may be carried out on the wafer at this time, using one or more optional chambers 512.

Figure 6:
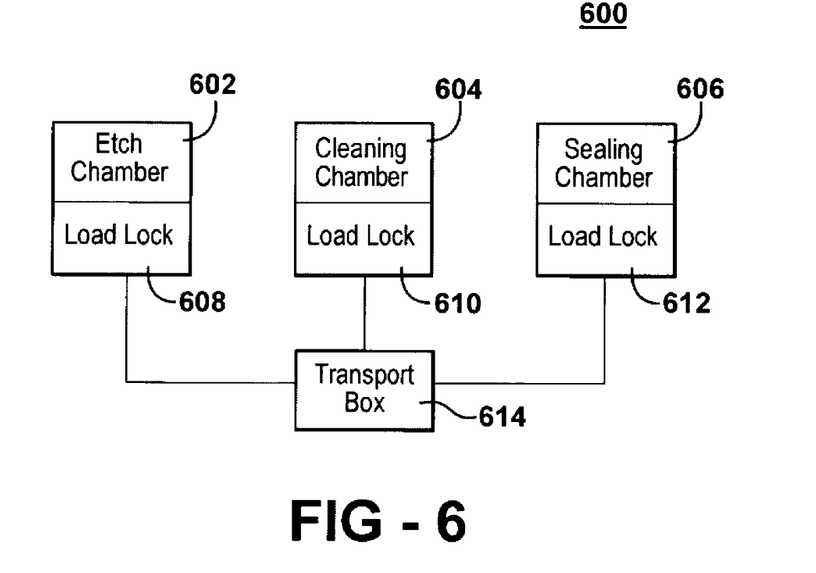
FIG. 6 is a block diagram of a standalone tool embodiment of a system in accordance with the principles of the present invention.

A standalone-tool system 600 in accordance with the principles of the present invention is depicted in the block diagram of FIG. 6. In this illustrative embodiment, standalone tools include an etching chamber 602, a cleaning chamber 604, and a seal deposition chamber 606. Each chamber has a loadlock port 608, 610, and 612, respectively. A transport box 614 may be used to shield chalcogenide wafers from exposure to oxygen or water as it transports a wafer among the chambers. The transport box 614 may be implemented as a vacuum front opening unified pod (FOUP), for example. Front opening unified pods are known and disclosed, for example, in U.S. Pat. No. 6,428,262 issued to Vanderpot et al.

A wafer of chalcogenide devices may be transported to the etch chamber 602 in the transport box 614 after the top electrode layer has been formed on the wafer, a mask has been formed using lithography, and the wafer is ready for device delineation. In such an embodiment, the wafer may be placed in the input loadlock 608 which takes the wafer from the ambient atmosphere of the work space to the anaerobic and/or anhydrous environment processing environment of the etch chamber 602. Alternatively, the wafer may be brought to an anaerobic and/or anhydrous environment (e.g. vacuum) within the transport box 614 before being introduced to the loadlock chamber 608.

In an illustrative embodiment in accordance with the principles of the present invention, before arriving at the etch chamber 602, the wafer will have been patterned with a mask at the time it arrives at the input loadlock 608. The mask determines the regions that will be exposed to the etch process and thereby defines individual devices within the wafer. In the etch chamber 602, the wafer is etched to delineate individual devices, as previously described. After etching in the etch chamber 602, the wafer is brought to the loadlock 608 and transferred to the transport box 614. The transport box 614 ensures that the wafer will remain shielded from oxygen and water exposure as it is transferred among the chambers, at least until after the device sidewalls are sealed in the sealing chamber 606.

After being loaded in the transport box 614, the wafer may be transferred to either the loadlock 610 of the optional cleaning chamber 604, if a cleaning step is to be performed, or directly to the loadlock 612 of the sealing chamber 606, where it may be processed as previously described.

We claim:
1. A method comprising:
providing a first processing chamber, said first processing chamber including a substrate having a layer of chalcogenide material formed thereon, said first processing chamber being equipped with a first load lock;
controlling the environment of said first processing chamber, said controlling including establishing anhydrous or anaerobic conditions in said first processing chamber;
removing a portion of said layer of chalcogenide material, said removing forming a sidewall surface of said chalcogenide material;

controlling the environment of said first load lock, said controlling including establishing anhydrous or anaerobic conditions in said first load lock;

transferring said substrate with said chalcogenide material having said sidewall layer from said first processing chamber to said first load lock;

attaching a portable transport box to said first load lock;

controlling the environment of said transport box, said controlling including establishing anhydrous or anaerobic conditions in said transport box;

transferring said substrate with said chalcogenide material having said sidewall surface from said first load lock to said transport box;

sealing said transport box;

detaching said transport box from said first load lock; and conveying said transport box through air to a second processing chamber, said second processing chamber being equipped with a second load lock.

2. The method of claim 1, wherein said second processing chamber is not connected to said first processing chamber.

3. The method of claim 1, further comprising attaching said transport box to said second load lock.

4. The method of claim 3, further comprising controlling the environment of said second load lock, said controlling including establishing anhydrous or anaerobic conditions in said second load lock.

5. The method of claim 4, further comprising transferring said substrate with said chalcogenide material having said sidewall surface from said transport box to said second load lock.

6. The method of claim 5, further comprising controlling the environment of said second processing chamber, said controlling including establishing anhydrous or anaerobic conditions in said second processing chamber.

7. The method of claim 6, further comprising transferring said substrate with said chalcogenide material having said sidewall surface from said second load lock to said second processing chamber.

8. The method of claim 7, further comprising forming a protective layer on said sidewall surface.

* * * * *